United States Patent
Huang (10) Patent No.: US 8,405,097 B2
(45) Date of Patent: Mar. 26, 2013

(54) OPTICAL SENSOR

(75) Inventor: Dong-Hai Huang, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/372,526

(22) Filed: Feb. 14, 2012

(65) Prior Publication Data

US 2012/0292727 A1 Nov. 22, 2012

(30) Foreign Application Priority Data

May 17, 2011 (TW) .............................. 100117284 A (51) Int. Cl.
*H01L 21/02* (2006.01)
(52) U.S. Cl. .......... 257/82; 257/432; 257/443; 257/463; 257/E21.218; 257/E27.151; 257/E27.135; 257/E31.004; 257/E31.049; 257/E31.111; 257/E31.127
(58) Field of Classification Search ............... 257/40, 257/55, 82, 432–463, E21.218, 27.131–27.139, 257/19.071, 31.004, 5, 49, 68, 99, 111, 127
See application file for complete search history.

(56) References Cited

U.S. PATENT DOCUMENTS

| | | | |
|---|---|---|---|
| 5,923,049 A * | 7/1999 | Bohm et al. ...................... | 257/55 |
| 6,300,612 B1 * | 10/2001 | Yu ............................... | 250/208.1 |
| 7,671,435 B2 | 3/2010 | Ahn | |
| 7,923,801 B2 * | 4/2011 | Tian et al. ...................... | 257/440 |
| 8,284,587 B2 * | 10/2012 | Sargent et al. ................ | 365/129 |
| 2008/0237668 A1 | 10/2008 | Swain et al. | |
| 2009/0124038 A1 | 5/2009 | Tuttle | |
| 2009/0261353 A1 * | 10/2009 | Gaebler et al. .................. | 257/82 |
| 2009/0325337 A1 * | 12/2009 | Cheng et al. .................... | 438/70 |
| 2010/0109060 A1 | 5/2010 | Mao et al. | |
| 2010/0151615 A1 | 6/2010 | Shiau et al. | |
| 2010/0164042 A1 | 7/2010 | Manabe | |
| 2010/0176474 A1 | 7/2010 | Kwon et al. | |
| 2010/0181632 A1 | 7/2010 | Yuasa | |
| 2010/0267185 A1 | 10/2010 | Iwabuchi et al. | |
| 2010/0297805 A1 | 11/2010 | Mabuchi | |
| 2011/0072409 A1 * | 3/2011 | Gambino et al. ............. | 716/136 |
| 2011/0309462 A1 * | 12/2011 | Sargent et al. ................ | 257/443 |

* cited by examiner

*Primary Examiner* — Michael Lebentritt
(74) *Attorney, Agent, or Firm* — Rabin & Berdo, P.C.

(57) ABSTRACT

An optical sensor and a method for manufacturing the same are provided. The optical sensor includes a first photosensitive layer, a first charge carrier collecting element, a second photosensitive layer and a second charge carrier collecting element. The first photosensitive layer has a first light incident surface. The first charge carrier collecting element is disposed on a surface of the first photosensitive layer opposite to the first light incident surface of the first photosensitive layer. The second photosensitive layer is adjacent to the first photosensitive layer and has a second light incident surface. The second charge carrier collecting element is disposed on a surface of the second photosensitive layer opposite to the second light incident surface of the second photosensitive layer.

7 Claims, 9 Drawing Sheets

OPTICAL SENSOR

This application claims the benefit of Taiwan Patent Application No. 100117284, filed May 17, 2011, the subject matter of which is incorporated herein by reference.

BACKGROUND

1. Technical Field

The disclosure relates in general to an optical sensor and a method for manufacturing the same and more particularly to an optical sensor having photosensitive layers of different thicknesses and a method for manufacturing the same.

2. Description of the Related Art

An optical sensor has characteristics of small volume and low cost with a trend of improving manufacturing process. Therefore, the optical sensor is applied for various business devices such as a digital camera, a portable camera, a printer, a scanner and a mobile phone. The optical sensor is used for capturing an optical energy, transforming the optical energy into a relating electric signal, and transforming the electric signal into digital information that is easy to be stored, sent and operated.

However, it is currently found that the optical sensor has different absorption lengths and quantum efficiency for lights of different wavelengths. It causes distortion of sensing results. In addition, the efficiency of the device can not be improved.

SUMMARY

The disclosure is directed to an optical sensor and a method for manufacturing the same. A thickness of a photosensitive layer of the optical sensor is adjusted according to a wavelength of a light that is mainly absorbed and sensed by a pixel, for increasing sensing efficiency of the optical sensor or obtaining a desired sensing effect.

According to one aspect of the present invention, an optical sensor is provided. The optical sensor comprises a first photosensitive layer, a first charge carrier collecting element, a second photosensitive layer and a second charge carrier collecting element. The first photosensitive layer has a first light incident surface. A first light is emitted toward the first light incident surface to get into the first photosensitive layer. The first charge carrier collecting element is disposed on a surface of the first photosensitive layer opposite to the first light incident surface of the first photosensitive layer. The first charge carrier collecting element is for collecting a charge carrier transformed from the first light by the first photosensitive layer. The second photosensitive layer is adjacent to the first photosensitive layer and has a second light incident surface. A second light is emitted toward the second light incident surface to get into the second photosensitive layer. The second charge carrier collecting element is disposed on a surface of the second photosensitive layer opposite to the second light incident surface of the second photosensitive layer. The second charge carrier collecting element is for collecting a charge carrier transformed from the second light by the second photosensitive layer. A wavelength of the first light and a wavelength of the second light are different. A thickness of the first photosensitive layer and a thickness of the second photosensitive layer are different.

According to another aspect of the present invention, a method for manufacturing an optical sensor is provided. The method comprises following steps. A first charge carrier collecting element and a second charge carrier collecting element adjacent to each other are formed in a substrate. A thickness of a first part of the substrate corresponding to the first charge carrier collecting element is made different from a thickness of a second part of the substrate corresponding to the second charge carrier collecting element. The first part of the substrate forms a first photosensitive layer. The second part of the substrate forms a second photosensitive layer. In the optical sensor, a first light is emitted into the first photosensitive layer. The first charge carrier collecting element is used for collecting a charge carrier transformed from the first light by the first photosensitive layer. A second light is emitted into the second photosensitive layer. The second charge carrier collecting element is used for collecting a charge carrier transformed from the second light by the second photosensitive layer. A wavelength of the first light and a wavelength of the second light are different.

The following description is made with reference to the accompanying drawings.

DETAILED DESCRIPTION

Figure 1:
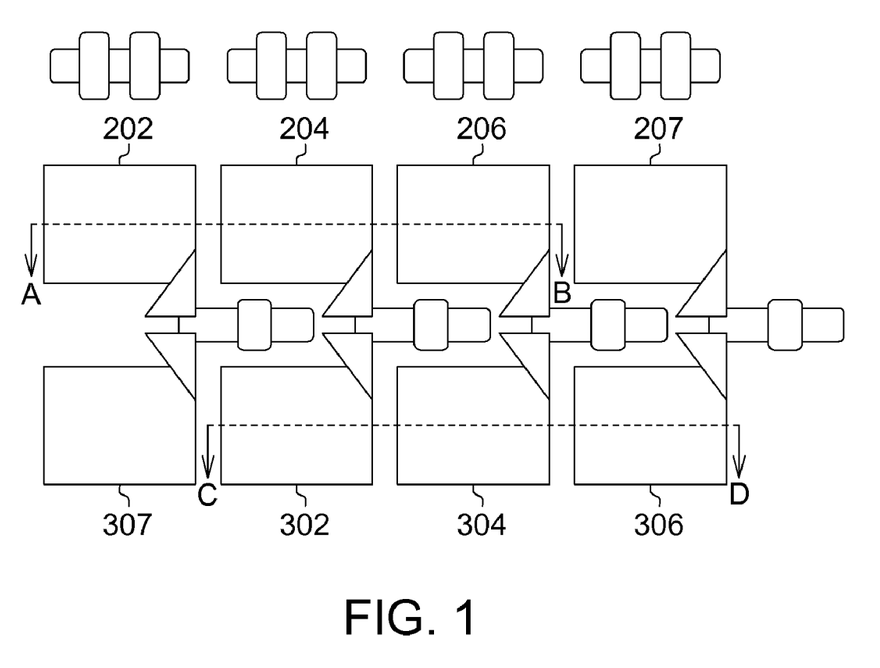
FIG. 1 illustrates a top view of an optical sensor in one embodiment.

FIG. 1 illustrates a top view of an optical sensor in one embodiment. Referring to FIG. 1, the optical sensor comprises a pixel 202, a pixel 204, a pixel 206, a pixel 207, a pixel 307, a pixel 302, a pixel 304 and a pixel 306, arranged with Bayer pattern. For example, the pixel 202 and the pixel 206 are red pixels. The pixel 204, the pixel 207, the pixel 307 and the pixel 304 are green pixels. The pixel 302 and the pixel 306 are blue pixels.

Figure 2A:
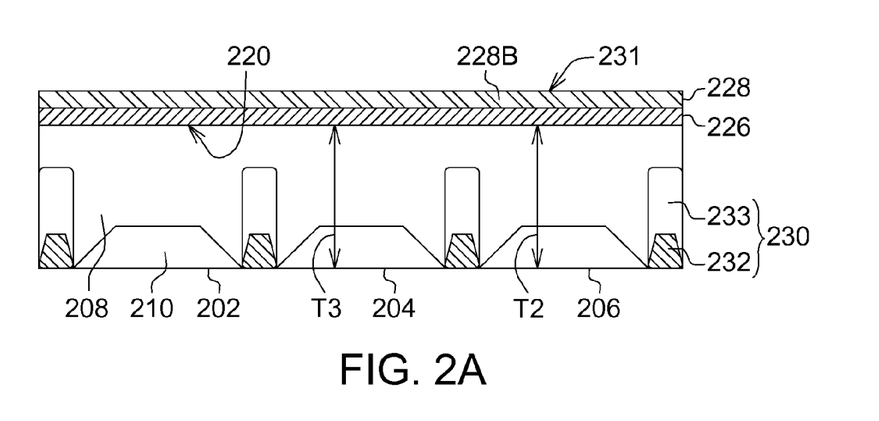
FIG. 2A and FIG. 2B illustrate cross-section views of an optical sensor in one embodiment.
Figure 2B:
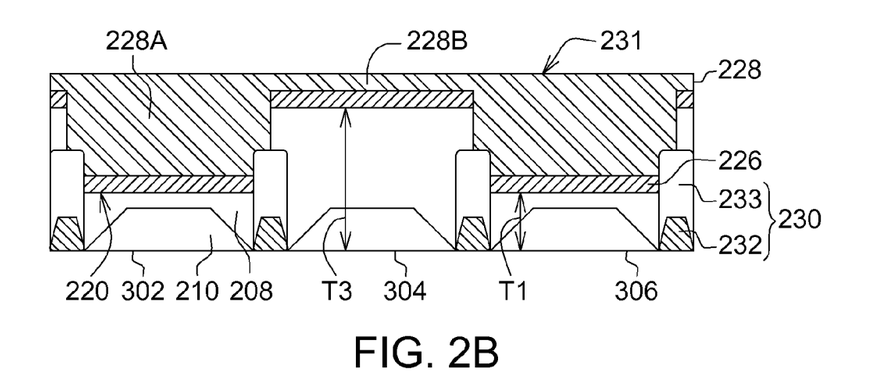

FIG. 2A and FIG. 2B illustrates cross-section views of the optical sensor in one embodiment. For example, FIG. 2A is drawn along AB line in FIG. 1. FIG. 2B is drawn along CD line in FIG. 1. Referring to FIG. 2A and FIG. 2B, each of the red pixel 202, the green pixel 204, the red pixel 206, the blue pixel 302, the green pixel 304 and the blue pixel 306 comprises a photosensitive layer 208 and a charge carrier collecting element 210 adjoined to the photosensitive layer 208. In an operation process for the optical sensor, The incident light is emitted toward the light incident surface 220 of the photosensitive layer 208 to get into the photosensitive layer 208. The optical energy emitted into the photosensitive layer 208 is transformed into a charge carrier by the photosensitive layer 208. The charge carrier moves to the charge carrier collecting element 210, and then is read by an external circuit. In embodiments, thickness of the photosensitive layers 208 of the red pixel 202, the green pixel 204, the red pixel 206, the blue pixel 302, the green pixel 304 and the blue pixel 306 are adjusted according to a wavelength or a main wavelength of the incident light, so as to increase the sensing efficiency of the optical sensor for various lights. For example, thicknesses T1 of the photosensitive layers 208 of the blue pixel 302 and the blue pixel 306 are smaller than thicknesses T2 of the photosensitive layers 208 of the red pixel 202 and the red pixel 206. The thickness T1 is also smaller than thicknesses T3 of the photosensitive layers 208 of the green pixel 204 and the green pixel 304. Because the thicknesses T1 of the photosensitive layers 208 of the blue pixel 302 and the blue pixel 306 are small, after a blue light having a short wavelength is emitted into the photosensitive layer 208, an initial generation location of a charge carrier is close to the charge carrier collecting element 210. Therefore, most charge carriers can efficiently move to and be collected by the charge carrier collecting element 210, increasing efficiency of the optical sensor. Because the thicknesses T2 of the photosensitive layers 208 of the red pixel 202 and the red pixel 206, and the thicknesses T3 of the photosensitive layers 208 of the green pixel 204 and the green pixel 304 are large, after a red light or a green light having wavelengths longer than a wavelength of a blue light, is emitted into the photosensitive layers 208, the photosensitive layers 208 having the big thickness T2 and thickness T3 can provide enough absorption length for red light energy and green light energy. Therefore, the red light and the green light can be efficiently absorbed and transformed into charge carriers.

In embodiments, the thickness T1, the thickness T2 and the thickness T3 are 1 m~4 um, respectively. The thickness T2 and the thickness T3 of the same are larger than the thickness T1 by 0.05 um~3 um or 0.3 um~3 um. Actually, an ordering of the thickness T1, the thickness T2, and the thickness T3 may be adjusted according to an intensity demand ratio and a color ratio for main wavelengths. For example, T1>T2>T3.

In other embodiments, the thicknesses of the photosensitive layers of the different pixel regions can be adjusted according to the demand quantum efficiency for the optical sensor properly.

Referring to FIG. 1, the optical sensor may also comprise a passivation layer 226 disposed on the photosensitive layer 208. An insulating layer 228 is disposed on the passivation layer 226. A portion 228A of the insulating layer 228 corresponding to the photosensitive layers 208 of the blue pixel 302 and the blue pixel 306 is thicker than a portion 228B of the insulating layer 228 corresponding to the photosensitive layers 208 of the red pixel 202, the red pixel 206, the green pixel 204 and the green pixel 304. In addition, the whole insulating layer 228 may have a substantially flat top surface 231.

The photosensitive layers 208 and the charge carrier collecting elements 210 of the red pixel 202, the green pixel 204, the red pixel 206, the blue pixel 302, the green pixel 304 and the blue pixel 306 are isolated by an isolation element 230. The isolation element 230 may comprise an isolation structure 232 and an isolation structure 233. The isolation element 230 may comprise an oxide such as silicon dioxide or silicon oxynitride, etc. The isolation element 230 is not limited to departing from the insulating layer 228 by a distance as shown in FIG. 2A and FIG. 2B. For example, the isolation element 230 may be extended to be contact with the insulating layer 228 at least so as to increase the isolation effect between different pixels.

Figure 3A:
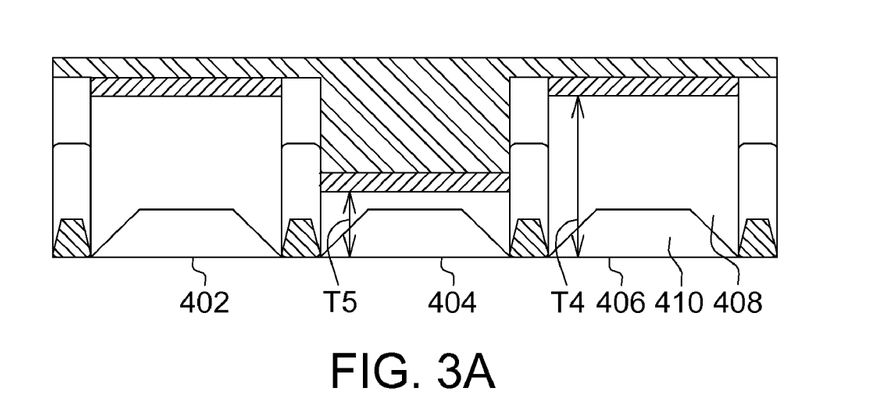
FIG. 3A and FIG. 3B illustrate cross-section views of an optical sensor in one embodiment.
Figure 3B:
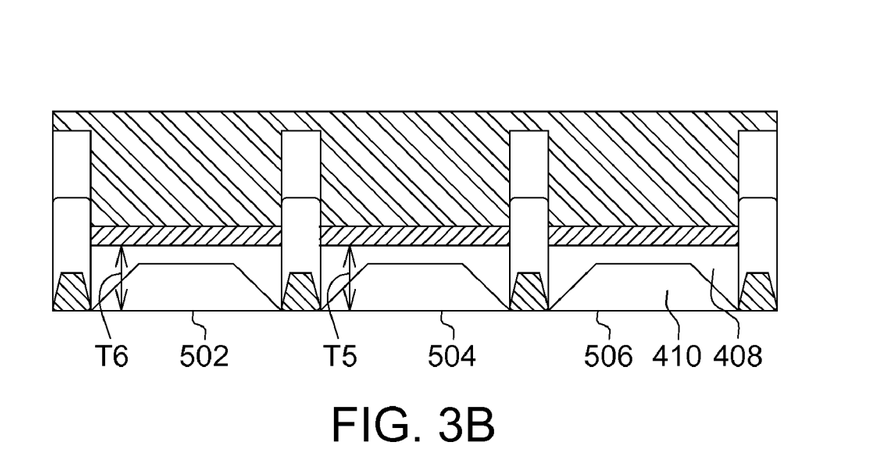

FIG. 3A and FIG. 3B illustrate cross-section views of the optical sensor in one embodiment. For example, FIG. 3A is drawn along AB line in FIG. 1. FIG. 3B is drawn along CD line in FIG. 1. The embodiment shown in FIG. 3A and FIG. 3B is different from the embodiment shown in FIG. 2A and FIG. 2B in that thicknesses T4 of the photosensitive layers 408 of the red pixel 402 and the red pixel 406 are larger than thicknesses T5 of the photosensitive layers 408 of the green pixel 404 and the green pixel 504. The thickness T4 is also larger than thicknesses T6 of the photosensitive layers 408 of the blue pixel 502 and the blue pixel 506. Because the thicknesses T4 of the photosensitive layers 408 of the red pixel 402 and the red pixel 406 are large, after a red light having a wavelength longer than wavelengths of a blue light and a green light is emitted into the photosensitive layers 408, the photosensitive layers 408 of the red pixel 402 and the red pixel 406 can provide enough absorption length for red light energy. Therefore, the red light can be efficiently absorbed and transformed into charge carriers. Because the thickness T5 and the thickness T6 are small, after a green light and a blue light having wavelengths shorter than a wavelength of a red light is emitted into the photosensitive layers 408 of the green pixel 404, the green pixel 504, the blue pixel 502 and the blue pixel 506, an initial generation location of a charge carrier is close to the charge carrier collecting element 410. Therefore, most charge carriers can efficiently move to and be collected by the charge carrier collecting element 410, increasing efficiency of the optical sensor. In embodiments, the thickness T1, the thickness T2 and the thickness T3 are 1 um~4 um, respectively. The same thickness T5 and thickness T6 are smaller than the thickness T4 by 0.05 um~3 um or 0.3 um~3 um.

Figure 4A:
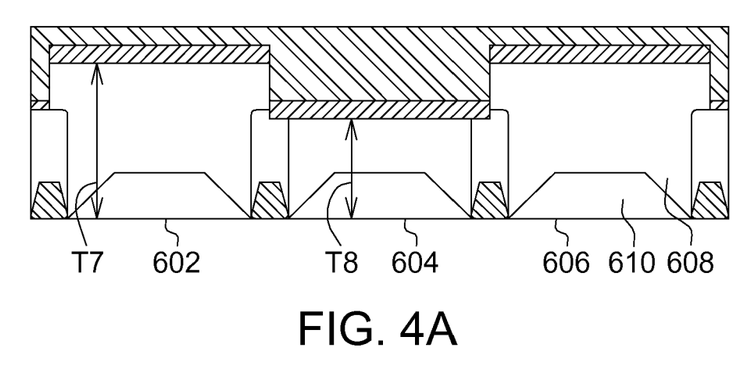
FIG. 4A and FIG. 4B illustrate cross-section views of an optical sensor in one embodiment.
Figure 4B:
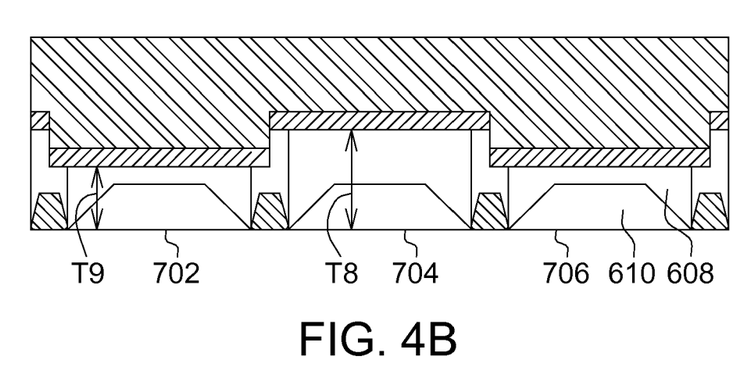

FIG. 4A and FIG. 4B illustrate cross-section views of the optical sensor in one embodiment. For example, FIG. 4A is drawn along AB line in FIG. 1. FIG. 4B is drawn along CD line in FIG. 1. The embodiment shown in FIG. 4A and FIG. 4B is different from the embodiment shown in FIG. 2A and FIG. 2B in that thicknesses T7 of the photosensitive layers 608 of the red pixel 602 and the red pixel 606 that a red light is mainly emitted into are larger than thicknesses T8 of the photosensitive layers 608 of the green pixel 604 and the green pixel 704 that a green light is mainly emitted into. The thicknesses T8 of the photosensitive layers 608 of the green pixel 604 and the green pixel 704 are larger than thicknesses T9 of the photosensitive layers 608 of the blue pixel 702 and the blue pixel 706 that a blue light is mainly emitted into. Thus, incident lights of different wavelengths can be efficiently absorbed and transformed into charge carriers by the optical sensor. In addition, the charge carriers can efficiently move to and collected by the charge carrier collecting element 610. Therefore, the efficiency of the optical sensor is improved. In one embodiment, the thickness T7, the thickness T8 and the thickness T9 are 1 um~4 um, respectively. In one embodiment, the thickness T7 is bigger than the thickness T8 by 0.05 um~3 um or 0.3 um~3 um. The thickness T8 is bigger than the thickness T9 by 0.05 um~3 um or 0.3 um~3 um.

Figure 5:
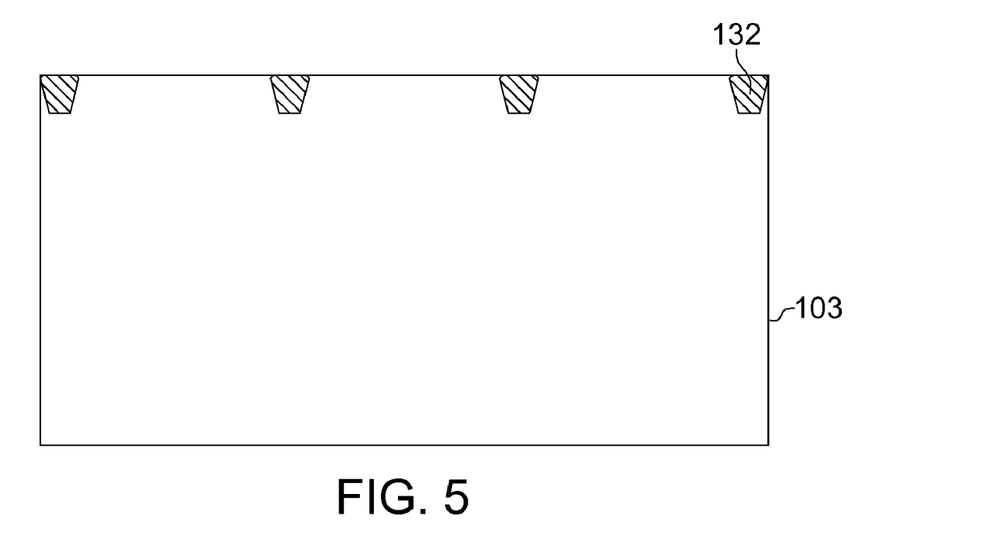
FIG. 5 to FIG. 13 illustrate a method for manufacturing an optical sensor in one embodiment.
Figure 6:
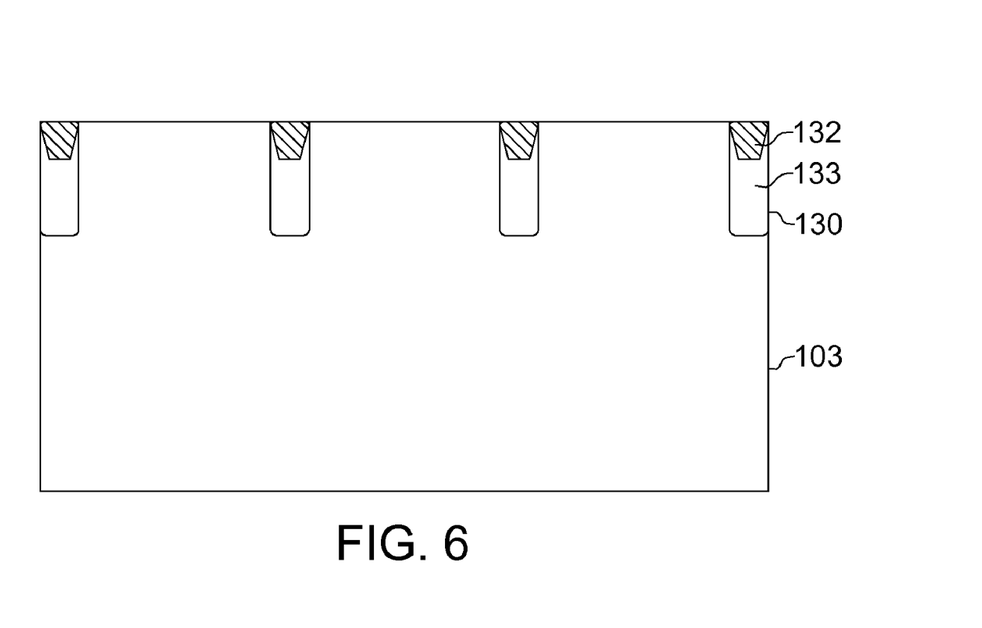

FIG. 5 to FIG. 13 illustrate a method for manufacturing the optical sensor in one embodiment. Referring to FIG. 5, a substrate 103 is provided. In embodiments, the substrate 103 comprises a semiconductor material such as silicon. For example, the substrate 103 is a part of a SOI substrate, or is formed by polishing a bulk-silicon by a CMP method and then depositing a film on the bulk-silicon by a CVD method. The isolation structure 132 is formed in the substrate 103. For example, the isolation structure 132 comprises a STI. The isolation structure 132 may be formed by doping a dopant such as boron having a conductivity type such as P type same with a conductivity type of the substrate 103. Referring to FIG. 6, the isolation structure 133 is formed in the substrate 103. The isolation structure 133 may be formed by doping a dopant such as boron having a conductivity type such as P type same with the conductivity type of the substrate 103. The isolation structure 132 and the isolation structure 133 form the isolation element 130. In some embodiments, the isolation structure 132 is omitted.

Figure 7:
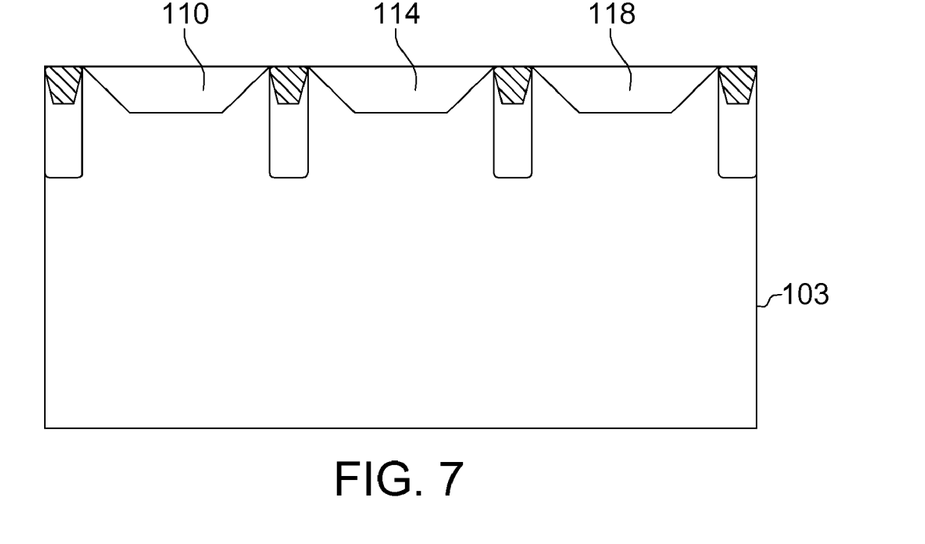
Figure 8:
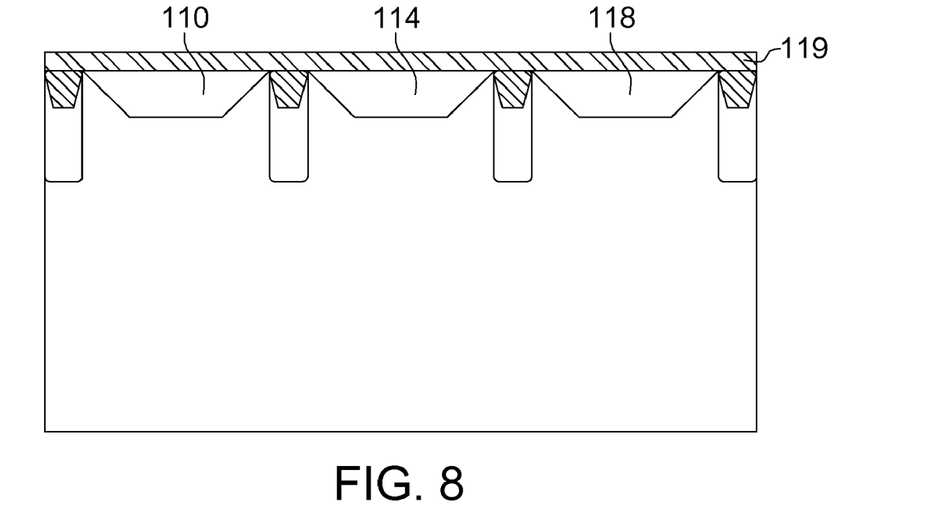

Referring to FIG. 7, the charge carrier collecting element 110, the charge carrier collecting element 114 and the charge carrier collecting element 118 are formed in the substrate 103. The charge carrier collecting element 110, the charge carrier collecting element 114 and the charge carrier collecting element 118 may be formed by doping a dopant such as As or P having a conductivity type such as N type opposite to the conductivity type such as P type of the substrate 103. Referring to FIG. 8, the insulating layer 119 is formed on the charge carrier collecting element 110, the charge carrier collecting element 114 and the charge carrier collecting element 118. The insulating layer 119 may comprise an oxide such as silicon oxide or silicon oxynitride, etc. The insulating layer 119 may be formed by a physical or chemical deposition method such as a plasma chemical method.

Figure 9:
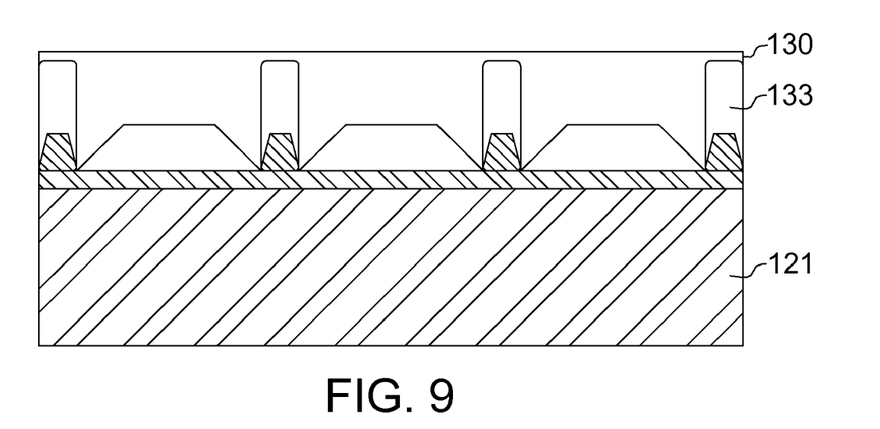
Figure 10:
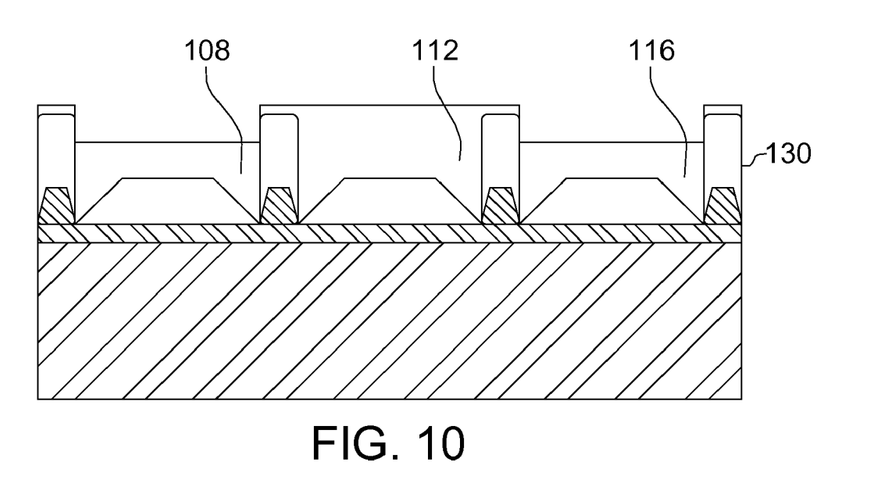

Referring to FIG. 9, after a support plate 121 is adhered to the substrate 103, the substrate 103 is reversed up and down. In addition, the substrate 103 is thinned. A thinning method comprises a physical method or chemical method. For example, a part of the substrate 103 is removed by an etching method such as a dry etching method or a wet etching method. In the embodiment shown in FIG. 9, after the substrate 103 is thinned, a portion upper than the isolation structure 133 is leaved. However, the present invention is not limited thereto. In other embodiments, the substrate 103 is thinned to be flush witch the top surface of the isolation structure 133. In other words, a part of the isolation structure 133 may be removed in the step for thinning the substrate 103. The thickness of the thinned substrate 103 may be 1 um~5 um. A part of the substrate 103 between the isolation elements 130 is removed for leaving the photosensitive layer 108, the photosensitive layer 112 and the photosensitive layer 116 of different thickness in different pixel regions, as shown in FIG. 10. A part of the substrate 103 may be removed by a physical method or a chemical method, such as a CMP method.

Figure 11:
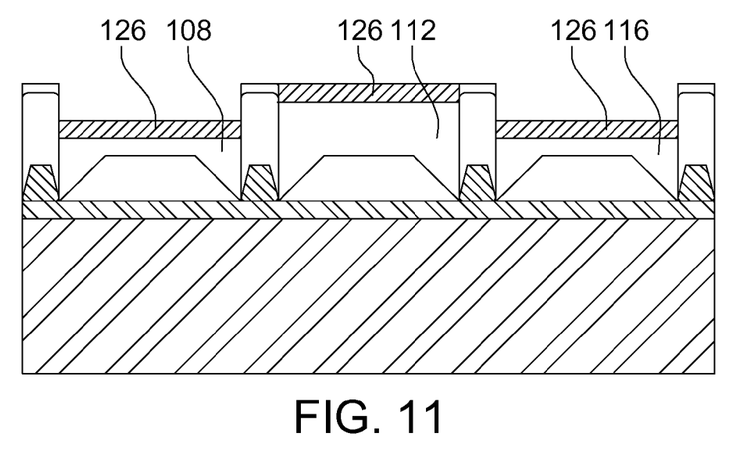
Figure 12:
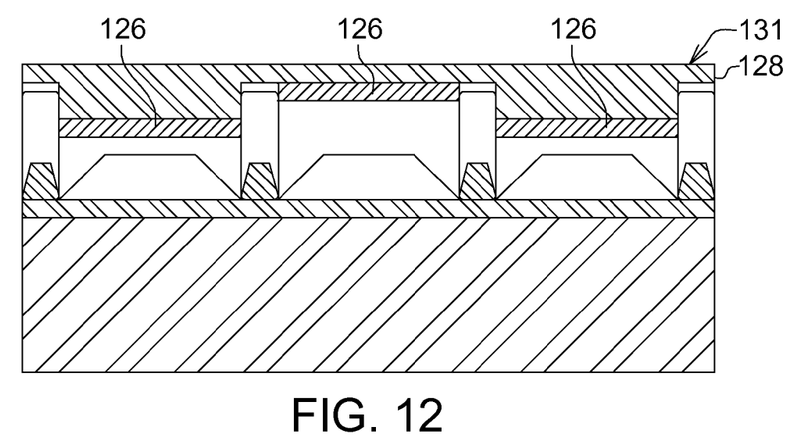

Referring to FIG. 11, the passivation layer 126 is formed on the photosensitive layer 108, the photosensitive layer 112 and the photosensitive layer 116. For example, the passivation layer 126 may be formed by doping a dopant having a conductivity type same with a conductivity type of the photosensitive layer 108, the photosensitive layer 112 and the photosensitive layer 116. A thickness of the passivation layer 126 may be about 500 angstrom~2000 angstrom. An anneal step such as heating to 800° C.~1000° C. or a laser annealing may be performed. Referring to FIG. 12, the insulating layer 128 is formed on the passivation layer 126. The insulating layer 128 comprises an oxide such as silicon dioxide or silicon oxynitride, etc. In one embodiment, a planarization step may be performed to the insulating layer 128 for forming the flat top surface 131.

Figure 13:
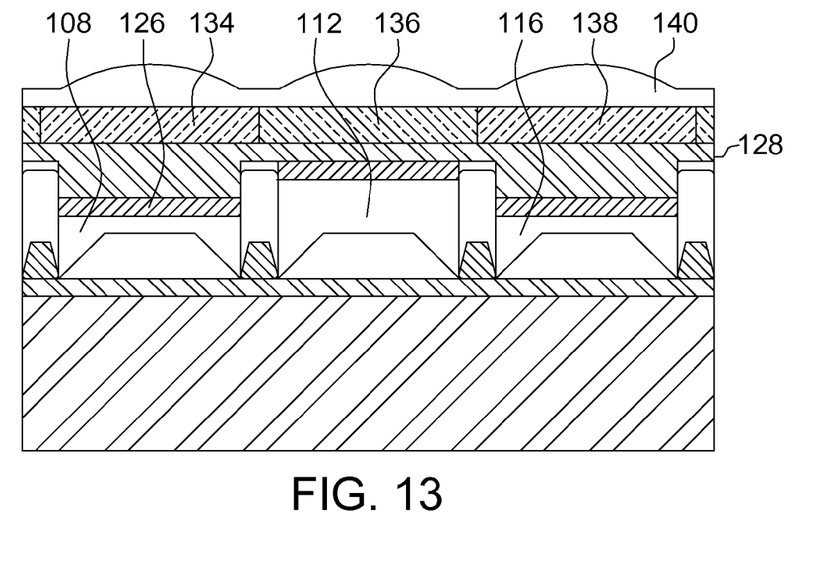

Referring to FIG. 13, the filter element 134, the filter element 136 and the filter element 138 are formed on the insulating layer. A microlens 140 may be formed on the filter element 134, the filter element 136 and the filter element. The filter element 134, the filter element 136 and the filter element 138 are used for filtering a desired wavelength or a main wavelength passing through. Then, the desired wavelength or the main wavelength passing through the passivation layer 126 and the insulating layer 128 is emitted into the photosensitive layer 108, the photosensitive layer 112 and the photosensitive layer 116. In embodiments, the optical sensor is a back light CMOS image sensor or other kinds of the sensor.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical sensor, comprising:
   a first photosensitive layer having a first light incident surface, wherein a first light is emitted toward the first light incident surface to get into the first photosensitive layer;
   a first charge carrier collecting element on a surface of the first photosensitive layer opposite to the first light incident surface of the first photosensitive layer, wherein the first charge carrier collecting element is for collecting a charge carrier transformed from the first light by the first photosensitive layer;
   a second photosensitive layer adjacent to the first photosensitive layer and having a second light incident surface, wherein a second light is emitted toward the second light incident surface to get into the second photosensitive layer; and
   a second charge carrier collecting element on a surface of the second photosensitive layer opposite to the second light incident surface of the second photosensitive layer, wherein the second charge carrier collecting element is for collecting a charge carrier transformed from the second light by the second photosensitive layer, wherein,
   a wavelength of the first light and a wavelength of the second light are different,
   a thickness of the first photosensitive layer and a thickness of the second photosensitive layer are different.

2. The optical sensor according to claim 1, wherein,
   the wavelength of the first light is greater than the wavelength of the second light,
   the thickness of the first photosensitive layer is greater than the thickness of the second photosensitive layer.

3. The optical sensor according to claim 1, wherein the thickness of the first photosensitive layer and the thickness of the second photosensitive layer are 1 um~4 um.

4. The optical sensor according to claim 1, wherein the thickness of the first photosensitive layer is greater than the thickness of the second photosensitive layer by 0.5 um~3 um, the first light is a green light, and the second light is a blue light.

5. The optical sensor according to claim 1, wherein the thickness of the first photosensitive layer is greater than the thickness of the second photosensitive layer by 0.3 um~3 um, the first light is a red light, the second light is a green light or a blue light.

6. The optical sensor according to claim 1, further comprising a filter element disposed on the first light incident surface of the first photosensitive layer and the second light incident surface of the second photosensitive layer, wherein,
   the filter element is for passing only the first light through the filter from a light emitted to a part of the optical sensor corresponding to the first photosensitive layer, and passing only the second light through the filter element from a light emitted to a part of the optical sensor corresponding to the second photosensitive layer.

7. The optical sensor according to claim 1, further comprising an insulating layer disposed on the first light incident surface of the first photosensitive layer and the second light incident surface of the second photosensitive layer, wherein,
   a thickness of a part of the insulating layer corresponding to the first photosensitive layer is smaller than a thickness of a part of the insulating layer corresponding to the second photosensitive layer, and the whole insulating layer has a substantially flat top surface.

* * * * *